US012446353B2

(12) United States Patent
Liu et al.

(10) Patent No.: US 12,446,353 B2
(45) Date of Patent: Oct. 14, 2025

(54) HYBRID HETEROJUNCTION SOLAR CELL, CELL COMPONENT AND PREPARATION METHOD

(71) Applicant: Trina Solar Co., Ltd, Changzhou (CN)

(72) Inventors: Wei Liu, Changzhou (CN); Yunyun Hu, Changzhou (CN); Daming Chen, Changzhou (CN); Kuiyi Wu, Changzhou (CN)

(73) Assignee: Trina Solar Co., Ltd, Changzhou (CN)

( * ) Notice: Subject to any disclaimer, the term of this patent is extended or adjusted under 35 U.S.C. 154(b) by 0 days.

(21) Appl. No.: 18/901,554

(22) Filed: Sep. 30, 2024

(65) Prior Publication Data

US 2025/0185379 A1 Jun. 5, 2025

(30) Foreign Application Priority Data

Dec. 4, 2023 (CN) ........................ 202311645077.X

(51) Int. Cl.
*H10F 71/00* (2025.01)
*H10F 10/164* (2025.01)
(Continued)

(52) U.S. Cl.
CPC ......... *H10F 77/211* (2025.01); *H10F 10/164* (2025.01); *H10F 71/103* (2025.01);
(Continued)

(58) Field of Classification Search
CPC .... H10F 10/164; H10F 71/00; H10F 71/1221; H10F 77/1642; H10F 77/315;
(Continued)

(56) References Cited

U.S. PATENT DOCUMENTS

2023/0352603 A1* 11/2023 Yu ........................ H10F 71/129
2024/0355941 A1* 10/2024 Hu ........................ H10F 77/20

FOREIGN PATENT DOCUMENTS

AU 2022310239 A1 11/2023
CN 111063760 4/2020
(Continued)

OTHER PUBLICATIONS

Office Action dated Jan. 12, 2024 in corresponding Chinese Patent Application No. 202311645077.X (Chinese language), 8 pages.
(Continued)

*Primary Examiner* — Earl N Taylor
(74) *Attorney, Agent, or Firm* — HOVEY WILLIAMS LLP

(57) ABSTRACT

The present disclosure provides a hybrid heterojunction solar cell, a cell component, and a preparation method, the hybrid heterojunction solar cell comprises a semiconductor substrate having a substrate front surface and a substrate back surface opposite to each other, wherein the substrate front surface is close to a light-facing side of the cell and the substrate back surface is close to a backlight side of the cell; at least two composite layers located on one side of the substrate front surface, each composite layer includes a multi-layer structure of a tunneling layer and a doped polysilicon layer sequentially arranged in a direction gradually away from the substrate front surface. The hybrid heterojunction solar cell, cell component and a preparation method provided by this disclosure can achieve a stable passivation effect on the cell surface, reduce light absorption in the non-metallic areas of the cell, and achieve better process control at the same time.

6 Claims, 9 Drawing Sheets

(51) Int. Cl.

| | |
|---|---|
| ***H10F 71/10*** | (2025.01) |
| ***H10F 77/164*** | (2025.01) |
| ***H10F 77/20*** | (2025.01) |
| ***H10F 77/30*** | (2025.01) |
| ***H10F 77/70*** | (2025.01) |

(52) U.S. Cl.
CPC ....... *H10F 71/121* (2025.01); *H10F 71/1221* (2025.01); *H10F 71/1224* (2025.01); *H10F 71/128* (2025.01); *H10F 71/129* (2025.01); *H10F 71/134* (2025.01); *H10F 71/138* (2025.01); *H10F 77/1642* (2025.01); *H10F 77/244* (2025.01); *H10F 77/315* (2025.01); *H10F 77/707* (2025.01)

(58) Field of Classification Search
CPC .... H10F 77/707; H10F 71/129; H10F 71/128; H10F 71/134; H10F 71/138; H10F 71/121; H10F 71/1224; H10F 71/103; H10F 77/122; H10F 77/1645; H10F 77/1662
See application file for complete search history.

(56) References Cited

FOREIGN PATENT DOCUMENTS

| | | | | | |
|---|---|---|---|---|---|
| CN | 111063761 | | | 4/2020 | |
| CN | 112310231 | | | 2/2021 | |
| CN | 215815893 | | | 2/2022 | |
| CN | 114613865 | | | 6/2022 | |
| CN | 114709294 | | | 7/2022 | |
| CN | 115207137 | | | 10/2022 | |
| CN | 115700925 | | | 2/2023 | |
| CN | 116632080 | A | * | 8/2023 | |
| CN | 116936675 | A | * | 10/2023 | |
| CN | 117153949 | A | * | 12/2023 | |
| CN | 117239012 | A | * | 12/2023 | |
| CN | 117352566 | A | * | 1/2024 | ....... H01L 31/02167 |
| CN | 114843368 | B | * | 3/2024 | ............. C30B 33/10 |
| CN | 220825582 | U | * | 4/2024 | |
| CN | 118248785 | A | * | 6/2024 | |
| CN | 118367039 | A | * | 7/2024 | |
| CN | 118507584 | A | * | 8/2024 | |
| CN | 118522779 | A | * | 8/2024 | |
| CN | 118538829 | A | * | 8/2024 | |
| CN | 118571982 | A | * | 8/2024 | |
| CN | 118571983 | A | * | 8/2024 | |
| JP | 2011040594 | | | 2/2011 | |
| WO | WO-2024157590 | A1 | * | 8/2024 | |
| WO | WO-2024157591 | A1 | * | 8/2024 | |

OTHER PUBLICATIONS

Office Action dated Jan. 12, 2024 in corresponding Chinese Patent Application No. 202311645077.X (English language), 8 pages.
Machine Translation of CN115700925, 11 pages.
Machine Translation of CN114613865, 10 pages.
Machine Translation of CN115207137, 16 pages.
Machine Translation of CN114709294, 11 pages.
Machine Translation of CN111063761, 10 pages.
Machine Translation of CN215815893, 9 pages.
Machine Translation of CN111063760, 10 pages.
Machine Translation of CN112310231, 7 pages.
Machine Translation of JP2011040594, 6 pages.
Examination Report mailed Sep. 30, 2024 in corresponding Australian Patent Application No. 2024219512, 4 pages.

* cited by examiner

HYBRID HETEROJUNCTION SOLAR CELL, CELL COMPONENT AND PREPARATION METHOD

CROSS-REFERENCE TO RELATED APPLICATION

The present non-provisional patent application claims priority to Chinese Patent Application No. 202311645077.X, filed Dec. 4, 2023, and entitled "Hybrid Heterojunction Solar Cell, Cell Component and Preparation Method." The entirety of the above identified Chinese patent application is hereby incorporated by reference into the present non-provisional patent application.

TECHNICAL FIELD

The present disclosure mainly relates to the field of solar cell technology, and in particular to a hybrid heterojunction solar cell, cell component and preparation method.

BACKGROUND

Heterojunction (HJT) cells have a series of advantages such as high conversion efficiency, few manufacturing processes, and disclosure of thin silicon wafers, and are considered as the third direction of change in the photovoltaic industry. As more and more companies enter the HJT cell track, it is expected that HJT cell technology will stand out among many cell technologies in the future, and HJT cells will achieve large-scale mass production. Although HJT cells are theoretically more efficient, one of the biggest problems with HJT solar cells is ultraviolet radiation-induced attenuation. Compared with other types of cells, the amorphous silicon/microcrystalline silicon layer of HJT cells is more susceptible to damage by ultraviolet radiation which produces defects on the surface, and compared with other types of cells, the HJT cells decay faster, resulting in a decrease in module efficiency.

Some existing technologies use cut-off film to filter ultraviolet rays, but ultraviolet rays are actually useful energy and the cut-off film causes the initial power to attenuate, or other existing technologies use UV light transfer solutions, but they will encounter the problem of yellowing of the film and cannot completely solve the problem of UV attenuation. In addition, in some cells, a single layer of doped polysilicon layer is grown and then partially etched to form a thin doped polysilicon layer structure in the non-metallic area which reduces the light absorption of the polysilicon layer. Since amorphous silicon has a large number of pinhole-like holes, the etching speed is difficult to control, and the process stability is poor during the mass production stage, making the production process more difficult. Therefore, there are still many deficiencies in the surface design methods of heterojunction cells in this field.

SUMMARY

The technical problem to be solved by the present disclosure is to provide a hybrid heterojunction solar cell, cell component and preparation method which can obtain stable passivation effect on the cell surface, reduce light absorption in non-metallic areas of the cell, and achieve better process control.

In order to solve the above technical problems, the present disclosure provides a hybrid heterojunction solar cell, which comprise a semiconductor substrate having a substrate front surface and a substrate back surface opposite to each other, wherein the substrate front surface is close to a light-facing side of the cell and the substrate back surface is close to a backlight side of the cell; at least two composite layers located on side of the substrate front surface, each composite layer includes a multi-layer structure of a tunneling layer and a doped polysilicon layer sequentially arranged in a direction gradually away from the substrate front surface.

Optionally, the semiconductor substrate includes single crystal silicon, a doping type of the semiconductor substrate includes N-type or P-type, and a thickness of the semiconductor substrate is 80 μm-180 μm.

Optionally, the substrate front surface includes a textured surface structure, and the substrate back surface includes a textured surface structure and/or a polished surface structure, wherein the textured surface structure includes a pyramid texture surface and/or a corrosion pit texture surface.

Optionally, the hybrid heterojunction solar cell further comprises an intrinsic amorphous silicon layer, a backside doped layer, a transparent conductive layer and a back metal electrode sequentially arranged on one side of the substrate back surface in a direction gradually away from the substrate back surface, wherein, the backside doped layer includes a single layer or a multi-layer structure composed of amorphous silicon, nanocrystalline silicon and/or microcrystalline silicon.

Optionally, a thickness of the intrinsic amorphous silicon layer is 5 nm-20 nm, and a thickness of the backside doped layer is 5 nm-45 nm.

Optionally, the transparent conductive layer includes a transparent oxide conductive film composed of doped indium oxide, zinc oxide and/or tungsten oxide, and a thickness of the transparent conductive layer is 70 nm-120 nm.

Optionally, the composite layers include a first doped polysilicon layer located in a first composite layer and a second doped polysilicon layer located in a second composite layer, the first composite layer is closer to the substrate front surface than the second composite layer, and a doping concentration of a lower surface of the second doped polysilicon layer close to the substrate front surface is greater than a doping concentration of an upper surface of the first doped polysilicon layer away from the substrate front surface.

Optionally, the first composite layer further includes a first tunneling layer, and the second composite layer further includes a second tunneling layer, wherein, a thickness of the first tunneling layer is 0.8 nm-2 nm, a thickness of the first doped polysilicon layer is 20 nm-40 nm, a thickness of the second tunneling layer is 1 nm-2.5 nm, and a thickness of the second doped polysilicon layer is 50 nm-150 nm.

Optionally, the hybrid heterojunction solar cell further comprises a plurality of spaced and adjacently arranged contact areas and non-contact areas on side of the substrate front surface, and each contact area includes at least two of the composite layers.

Optionally, each non-contact area only includes one composite layer.

Optionally, the hybrid heterojunction solar cell further comprises a dielectric antireflection layer, located in an outermost layer of the contact areas and the non-contact areas away from the substrate front surface.

Optionally, the dielectric antireflection layer includes a single dielectric layer or a stacked dielectric layer composed of one or more dielectric materials among aluminum oxide, silicon oxide, silicon nitride, silicon oxynitride and magnesium fluoride, and a thickness of the dielectric antireflection layer is 60 nm-120 nm.

In order to solve the above technical problems, another aspect of the present disclosure also provides a cell component, which comprises a plurality of hybrid heterojunction solar cells as described above connected in series and/or in parallel.

In order to solve the above technical problems, another aspect of the present disclosure also provides a method of preparing hybrid heterojunction solar cell, which comprises following steps: preparing semiconductor substrate, the semiconductor substrate has a substrate front surface and a substrate back surface opposite to each other, wherein the substrate front surface is close to a light-facing side of the cell and the substrate back surface is close to a backlight side of the cell; preparing at least two composite layers and a positive metal electrode on the substrate front surface sequentially, each composite layer includes a multi-layer structure of a tunneling layer and a doped polysilicon layer sequentially arranged in a direction gradually away from the substrate front surface; and preparing an intrinsic amorphous silicon layer, a single layer, or a multi-layer structure of doped amorphous silicon, nanocrystalline silicon or microcrystalline silicon, a transparent conductive layer, and a back metal electrode on the substrate back surface sequentially.

Optionally, a method for preparing at least two composite layers further includes: sequentially forming a first tunneling layer, a first doped polysilicon layer, a second tunneling layer and a second doped polysilicon layer on the substrate front surface; laser scanning part of the second doped polysilicon layer to grow a silicon oxide film to obtain a first semi-finished cell, the first semi-finished cell has a plurality of spaced and adjacently arranged contact areas and non-contact areas on side of the substrate front surface, wherein, the contact areas are scanned by the laser, and the non-contact areas are not scanned by the laser; etching the first semi-finished cell by using alkaline solution to remove the second doped polysilicon layer of the non-contact areas; removing the silicon oxide film and the second tunneling layer of the non-contact areas, so that each of the contact areas includes two composite layers, and each of the non-contact areas only includes one composite layer.

Optionally, the preparation method further comprises when preparing the semiconductor substrate, etching the semiconductor substrate by using alkali solution to remove contaminants and form an antireflective texture structure.

Optionally, a method of forming the tunneling layer is thermal oxidation, and a method of forming the polysilicon layer is LPCVD method or PECVD method.

Optionally, when forming the doped polysilicon layer, the method further includes forming a microcrystalline silicon layer first, and at a temperature of 800° C.-930° C., doping with a doping source of phosphorus, annealing and crystallizing the microcrystalline silicon layer to form the doped polysilicon layer.

Optionally, the preparation method further comprises using ALD method or PECVD method to prepare a dielectric antireflection layer on the substrate front surface, and the dielectric antireflection layer includes a single dielectric layer or a stacked dielectric layer composed of one or more dielectric materials among aluminum oxide, silicon oxide, silicon nitride, silicon oxynitride and magnesium fluoride.

Optionally, the preparation method further comprises laser scanning part of the dielectric antireflection layers located in the contact areas to expose the second doped polysilicon layer in the contact areas, and preparing the positive metal electrode on exposed second doped polysilicon layer.

Compared with the existing technology, this disclosure adopts a solar cell with a multi-layer structure of a tunneling layer and a doped polysilicon layer, which can achieve a stable passivation effect on the surface of the cell. A dielectric antireflection film is arranged to reduce light absorption while reducing costs. The tunneling oxide layer on the top layer is designed to better prevent etching during the preparation process and achieve better process control.

BRIEF DESCRIPTION OF THE DRAWINGS

The drawings are included to provide a further understanding of the present disclosure, and they are included and constitute a part of the present disclosure, the drawings show the embodiments of the present disclosure, and serving to explain the principles of the present disclosure together with the description. In the drawings.

PREFERRED EMBODIMENT OF THE PRESENT DISCLOSURE

Figure 1:
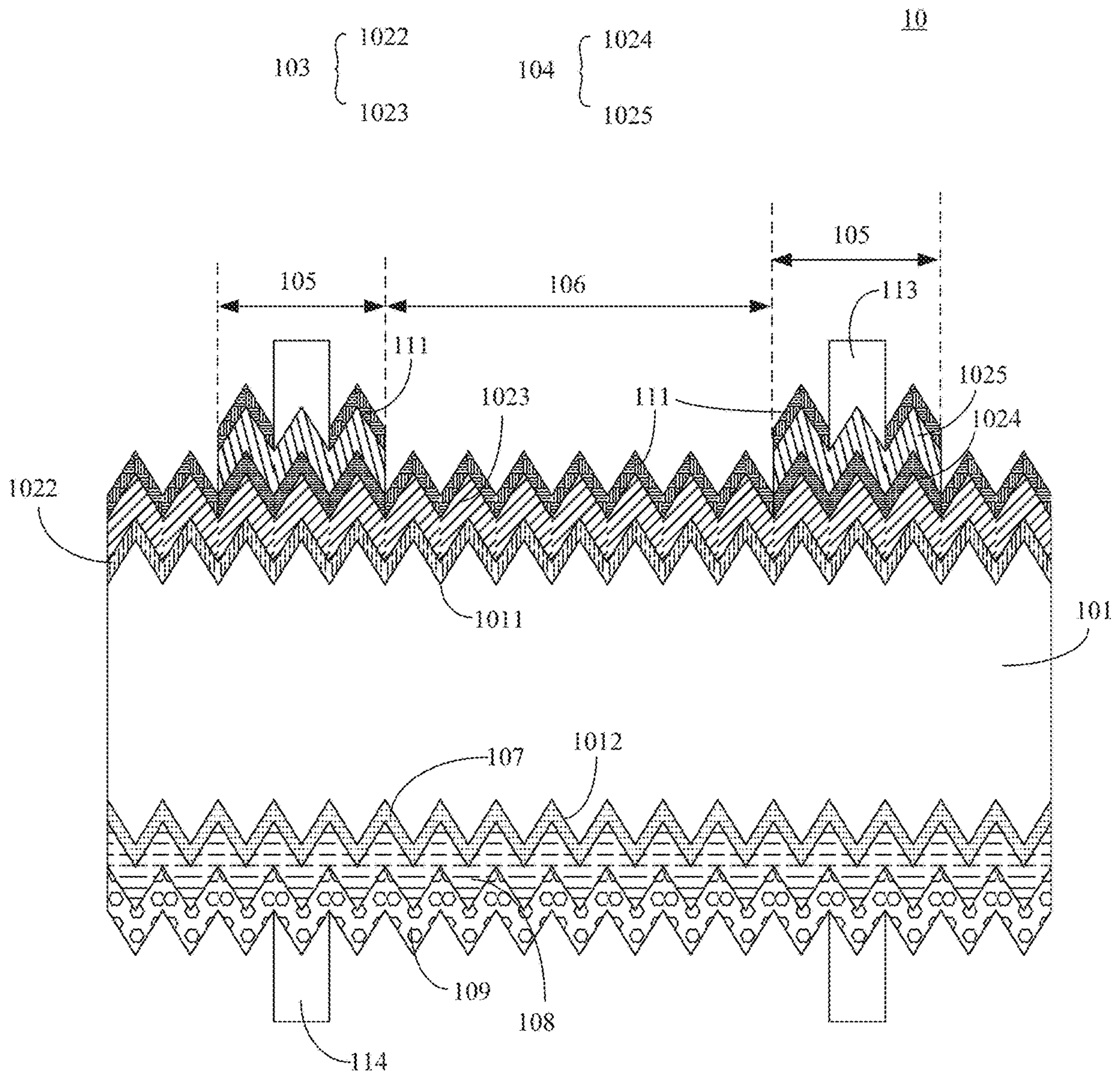
FIG. 1 is a schematic structural diagram of a hybrid heterojunction solar cell in an embodiment of the present disclosure.

In order to illustrate the technical solutions in the embodiments of the present disclosure more clearly, the drawings that need to be used in the description of the embodiments will be briefly introduced below. Obviously, the drawings in the following description are only some embodiments of the present disclosure, and for those skilled in the art, other drawings can also be obtained based on these drawings without creative effort.

As indicated in this disclosure and claims, the terms “a”, “an”, “a kind of” and/or “the” do not specifically refer to the singular and may include the plural unless the context clearly indicates an exception. Generally speaking, the terms “comprising” and “including” only suggest the inclusion of clearly identified steps and elements, and these steps and elements do not constitute an exclusive list, and the method or device may also contain other steps or elements.

The relative arrangements of components and steps, numerical expressions and numerical values set forth in these embodiments do not limit the scope of the present disclosure unless specifically stated otherwise. At the same time, it should be understood that, for the convenience of description, the sizes of the various parts shown in the drawings are not drawn according to the actual proportional relationship. Techniques, methods, and devices known to those of ordinary skill in the relevant art may not be discussed in detail, but where appropriate, such techniques, methods and devices should be considered part of the authorized specification. In all embodiments shown and discussed herein, any specific values should be construed as illustrative only, and not as limiting. Therefore, other examples of the exemplary embodiment may have different values. It should be noted that like numerals and letters denote like items in the following figures, therefore, once an item is defined in one figure, it does not require further discussion in subsequent drawings.

In the description of the present disclosure, it should be understood that orientation words such as "front, back, up, down, left, right", "landscape, portrait, vertical, horizontal" and "top, bottom" etc. indicating the orientation or positional relationship is generally based on the orientation or positional relationship shown in the drawings, only for the convenience of describing the disclosure and simplifying the description, in the absence of a contrary statement, these orientation words do not indicate or imply that the device or element referred to must have a specific orientation or be constructed and operated in a specific orientation, and therefore cannot be construed as limiting the scope of protection of this disclosure; the orientation words "inside and outside" refer to inside and outside relative to the outline of each part itself.

For the convenience of description, spatially relative terms may be used here, such as "on . . . ", "over . . . ", "on the upper surface of . . . ", "above", etc., to describe the spatial positional relationship between one device or feature and other devices or features. It will be understood that, in addition to the orientation depicted in the drawings, the spatially relative terms are intended to encompass different orientations of the device in use or operation. For example, if the device in the drawings is turned over, devices described as "on other devices or configurations" or "above other devices or configurations" would then be oriented "beneath other devices or configurations" or "under other devices or configurations". Thus, the exemplary term "above" can encompass both an orientation of "above" and "beneath". The device may be otherwise oriented (rotated 90 degrees or at other orientations), and making a corresponding explanation for the space relative description used here.

In addition, it should be noted that the use of words such as "first" and "second" to define components is only for the convenience of distinguishing corresponding components, unless otherwise stated, the above words have no special meanings, and therefore cannot be construed as limiting the protection scope of the present disclosure. In addition, although the terms used in this disclosure are selected from well-known and commonly used terms, some terms mentioned in the specification of this disclosure may be selected by the applicant according to his or her judgment, and their detailed meanings are listed in this article described in the relevant section of the description. Furthermore, it is required that this disclosure be understood not only by the actual terms used, but also by the meaning implied by each term.

This disclosure proposes a hybrid heterojunction solar cell 10 (hereinafter referred to as "cell 10") with reference to FIG. 1. The cell 10 mainly includes a semiconductor substrate 101, with a substrate front surface 1011 and a substrate back surface 1012 opposite to each other, wherein the substrate front surface 1011 is close to a light-facing side of the cell and the substrate back surface 1012 is close to a backlight side of the cell. Specifically, the semiconductor substrate 101 includes single crystal silicon, a doping type of the semiconductor substrate 101 includes N-type or P-type, and a thickness of the semiconductor substrate 101 is 80 μm-180 μm, for example, it may be 80 μm, 100 μm, 120 μm, 140 μm, 150 μm or 180 μm, preferably 110 μm-130 μm. Further, the substrate front surface 1011 can be prepared as a textured surface structure, while the substrate back surface 1012 can be prepared as a textured surface structure and/or a polished surface structure, wherein the textured surface structure includes a pyramid texture surface and/or a corrosion pit texture surface.

Further, the hybrid heterojunction solar cell proposed in any embodiment of the present disclosure further comprises at least two composite layers located on side of the substrate front surface, each composite layer includes a multi-layer structure of a tunneling layer and a doped polysilicon layer sequentially arranged in a direction gradually away from the substrate front surface. Specifically, in the embodiment shown in FIG. 1, it is preferably implemented with two composite layers, including a first composite layer 103 and a second composite layer 104. Further, the first composite layer 103 includes a first tunneling layer 1022 and a first doped polysilicon layer 1023, and the second composite layer 104 includes a second tunneling layer 1024 and a second doped polysilicon layer 1025. The first composite layer 103 is closer to the substrate front surface 1011 than the second composite layer 104.

Further, the first composite layer 103 and the second composite layer 104 each has a first tunneling layer 1022 and a second tunneling layer 1024. Both the first tunneling layer 1022 and the second tunneling layer 1024 may be $SiO_2$ tunneling layers. The second tunneling layer 1024 serves as a barrier layer in the diffusion process, and since the doping elements have to pass through the barrier layer during the doping process to reach the first doped polysilicon layer 1023 located under the second tunneling layer 1024, it can reduce the doping concentration of the underlying first doped polysilicon layer 1023.

In this embodiment, a thickness of the first tunneling layer 1022 is 0.8 nm-2 nm. A thickness of the first doped polysilicon layer 1023 is 20 nm-40 nm. A thickness of the second tunneling layer 1024 is 1 nm-2.5 nm. A thickness of the second doped polysilicon layer 1025 is 50 nm-150 nm.

The cell 10 further comprises an intrinsic amorphous silicon layer 107, a backside doped layer 108, a transparent conductive layer 109 and a back metal electrode 114 sequentially arranged on side of the substrate back surface 1012 in a direction gradually away from the substrate back surface 1012. Specifically, a thickness of the intrinsic amorphous silicon layer 107 is 5 nm-20 nm; a thickness of the backside doped layer 108 is 5 nm-45 nm, and the backside doped layer 108 includes a single layer or a multi-layer structure composed of amorphous silicon, nanocrystalline silicon and/or microcrystalline silicon, its doping type is the same as or opposite to that of the semiconductor substrate 101, and is opposite to the doping type of the first doped polysilicon layer 1023 and the second doped polysilicon layer 1025 located on the substrate front surface 1011; the transparent conductive layer 109 includes a transparent oxide conductive film composed of doped indium oxide, zinc oxide and/or tungsten oxide, and a thickness of the transparent conductive layer is 70 nm-120 nm.

Referring to FIG. 1, it can be seen that on side of the substrate front surface 1011 it includes a plurality of spaced and adjacently arranged contact areas 105 and non-contact areas 106, wherein each contact area 105 includes at least the two composite layers 103 and 104 as described above, while each non-contact area 106 only includes one composite layer 103. According to FIG. 1, a positive metal electrode 113 is located in each contact area 105. That is, in the contact area 105 (which can also be understood as a metal area) with the positive metal electrode 113, there are two layers of composite layers 103 and 104, while in the non-contact area

106 (which can also be understood as a non-metal area) without the positive metal electrode 113, there is only one composite layer 103.

In this embodiment, the doping concentration of the first doped polysilicon layer 1023 and the second doped polysilicon layer 1025 within the respective layers themselves gradually decreases in a direction from the upper surface farther away from the substrate front surface 1011 to the lower surface closer to the substrate front surface 1011, that is, in the first doped polysilicon layer 1023 and the second doped polysilicon layer 1025, the doping concentration of the lower surface is smaller than the doping concentration of the upper surface. In this embodiment, preferably, the doping concentration of a lower surface of the second doped polysilicon layer 1025 close to the substrate front surface 1011 is greater than a doping concentration of an upper surface of the first doped polysilicon layer 1023 away from the substrate front surface 1011. In this way, it can be better controlled that the doping concentration of the first doped polysilicon layer 1023 in the non-metal area (the non-contact area 106 without the positive metal electrode 113) must be smaller than the doping concentration of the second doped polysilicon layer 1025 in the metal area (the contact area 105 with the positive metal electrode 113), which achieves precise and strict control of the doping concentration of the doped polysilicon layer in the non-metallic area, thereby achieving stable surface passivation effect and low light absorption.

According to FIG. 1, the cell 10 further includes a dielectric antireflection layer 111, which is located in the outermost layer of the contact area 105 and the non-contact area 106 further away from the substrate front surface 1011. The dielectric antireflection layer 111 includes a single dielectric layer or a stacked dielectric layer composed of one or more dielectric materials among aluminum oxide, silicon oxide, silicon nitride, silicon oxynitride and magnesium fluoride, and a thickness of the dielectric antireflection layer is 60 nm-120 nm. In this embodiment, the dielectric antireflection layer 111 replaces the transparent conductive film commonly used in heterojunction cells in the prior art, which can further reduce the cost while reducing light absorption.

Based on the structure of the cell 10 mentioned above, the present disclosure also provides a cell component, which comprises a plurality of hybrid heterojunction solar cells 10 as described above connected in series and/or in parallel.

Another embodiment of the present disclosure also proposes a method 20 of preparing a hybrid heterojunction solar cell (hereinafter referred to as "method 20") with reference to FIG. 2. The flow chart is used in FIG. 2 of this disclosure to illustrate the operations performed by the system according to the embodiment of this disclosure. It should be understood that the preceding or following operations are not necessarily performed in an exact order. Instead, various steps may be processed in reverse order or concurrently. At the same time, other operations can either add to these procedures, or a certain step or steps can be removed from these procedures.

Figure 2:
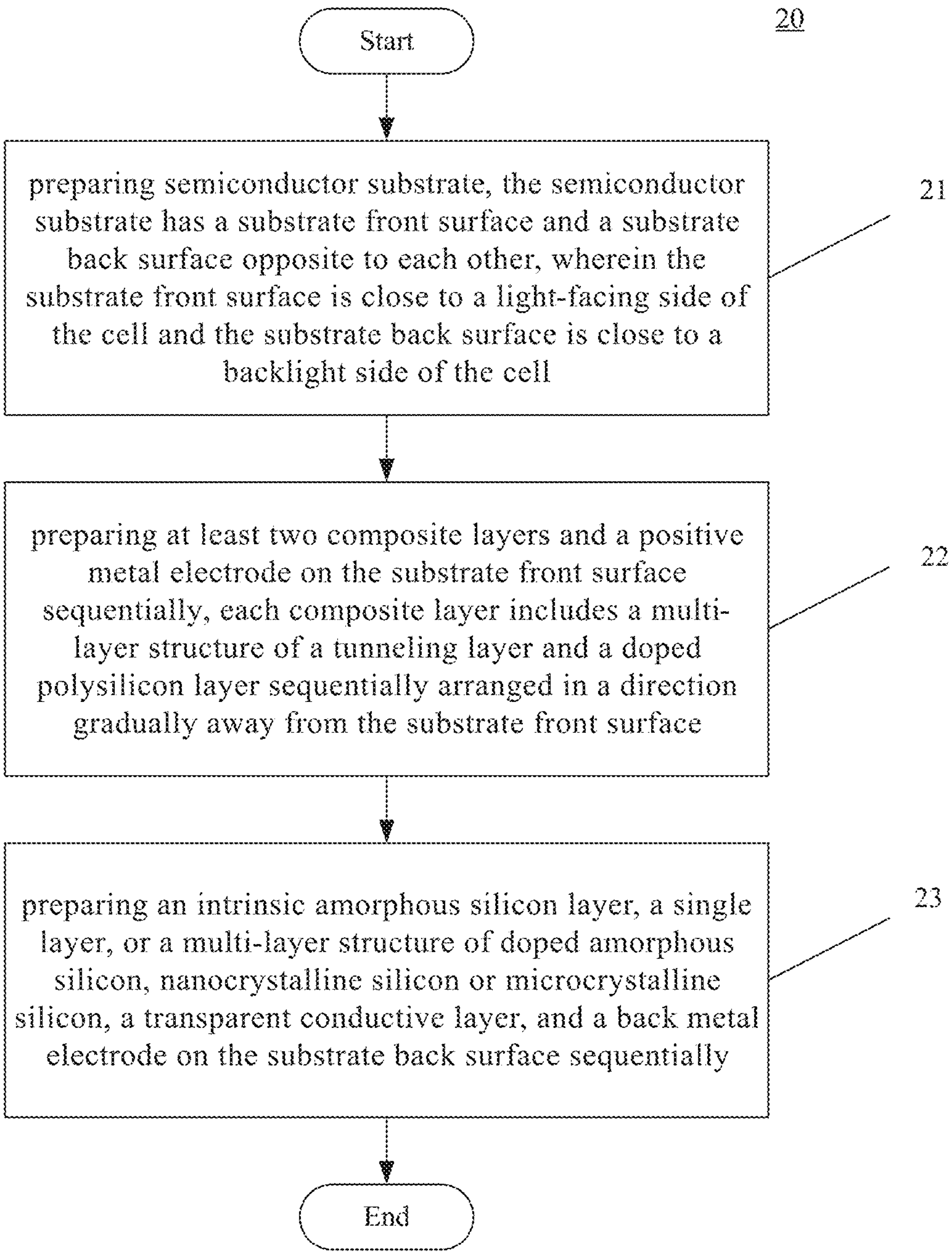
FIG. 2 is a schematic flow chart of a method of preparing a hybrid heterojunction solar cell according to an embodiment of the present disclosure.

Referring to FIG. 2, method 20 includes the following steps. Step 21 is preparing semiconductor substrate, the semiconductor substrate has a substrate front surface and a substrate back surface opposite to each other, wherein the substrate front surface is close to a light-facing side of the cell and the substrate back surface is close to a backlight side of the cell. Step 22 is preparing at least two composite layers and a positive metal electrode on the substrate front surface sequentially, each composite layer includes a multi-layer structure of a tunneling layer and a doped polysilicon layer sequentially arranged in a direction gradually away from the substrate front surface, wherein the doping type of the doped polysilicon layer is the same as or opposite to that of the semiconductor substrate. Step 23 is preparing an intrinsic amorphous silicon layer, a single layer, or a multi-layer structure of doped amorphous silicon, nanocrystalline silicon or microcrystalline silicon, a transparent conductive layer, and a back metal electrode on the substrate back surface sequentially.

Figure 3:
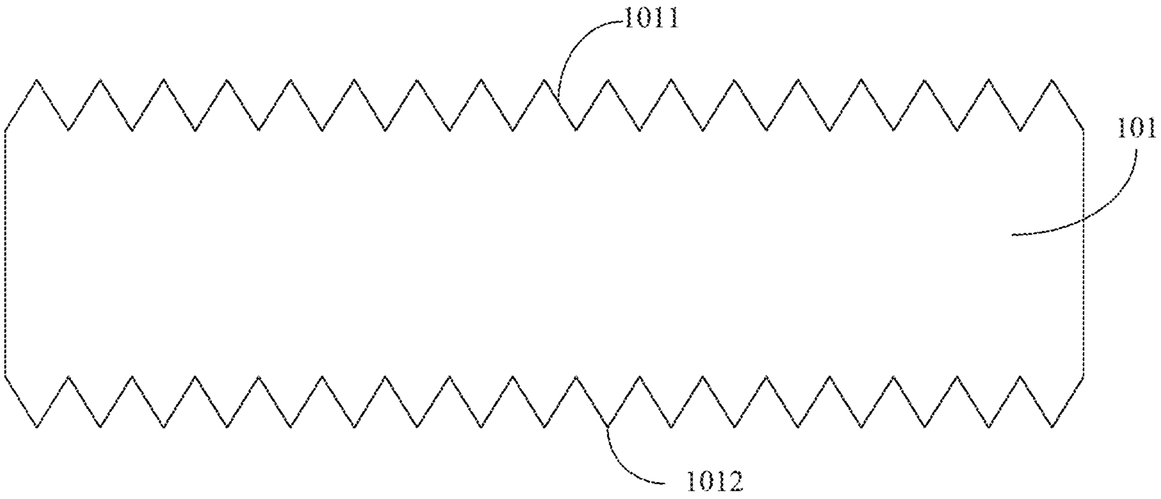
FIG. 3-FIG. 9 are schematic structural diagrams of a hybrid heterojunction solar cell in different preparation processes according to an embodiment of the present disclosure.

Illustratively, the method 20 can be used to prepare the cell 10 as shown in FIG. 1. The following takes the disclosure of method 20 to cell 10 as an example to further introduce more details of cell 10 and method 20. For details, reference may be made to the schematic structural diagrams of the cell 10 in different preparation processes shown in FIGS. 3 to 9. Referring first to FIG. 3, when preparing the semiconductor substrate 101, it first provides an initial N-type semiconductor substrate layer, cleans and textures the semiconductor substrate layer, and then etches the semiconductor substrate 101 by using alkali solution to remove contaminants and form an antireflective texture structure, thereby producing the semiconductor substrate 101.

Figure 4:
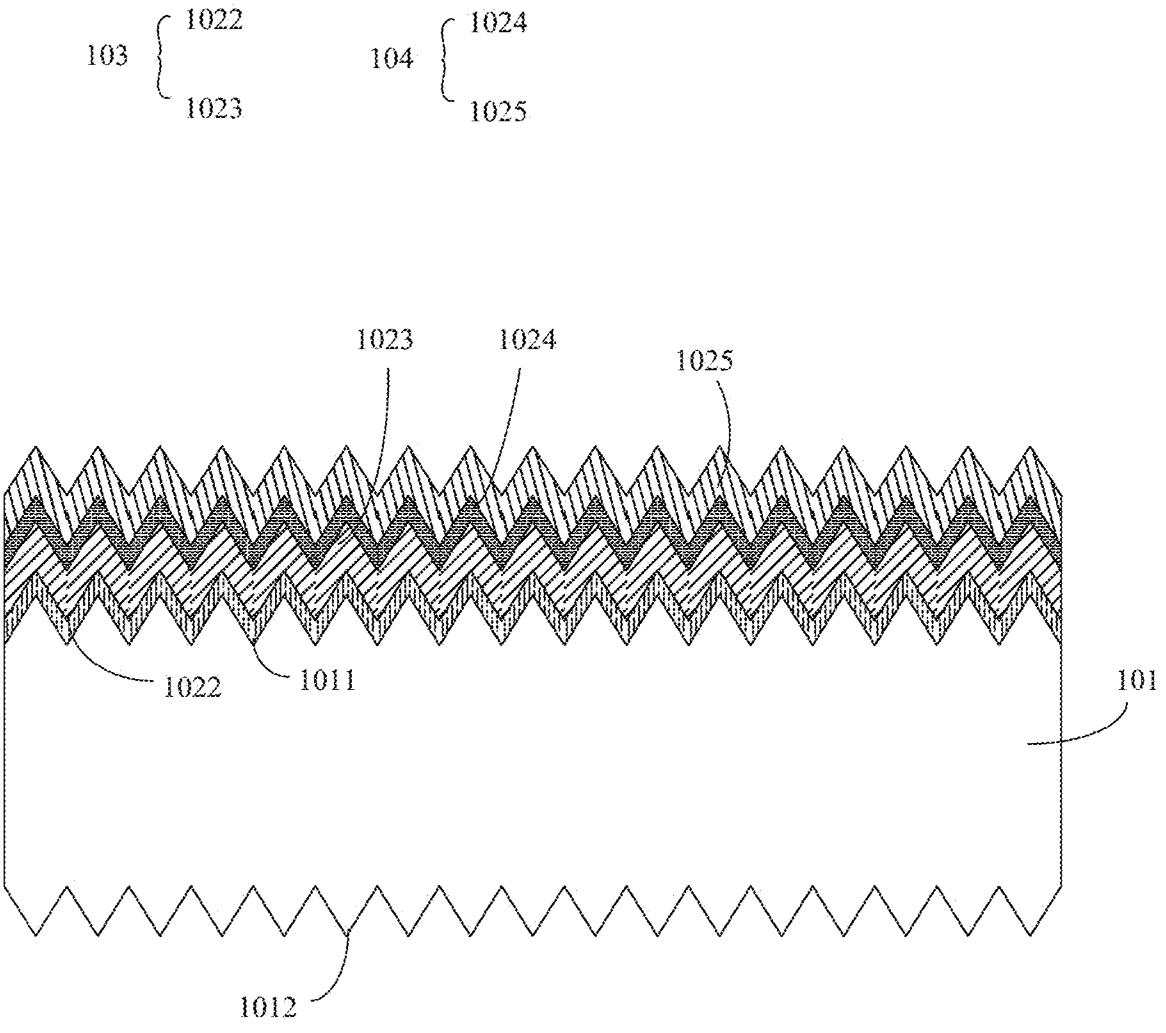

Referring to FIG. 4, on the substrate front surface 1011, it forms tunneling layers by using thermal oxidation, and forms polysilicon layers with LPCVD method or PECVD method. Specifically, on the substrate front surface 1011, it sequentially forms the first tunneling layer 1022 and the first doped polysilicon layer 1023 to form the first composite layer 103, and forms the second tunneling layer 1024 and the second doped polysilicon layer 1025 to form the second composite layer 104. In this embodiment, a structure of two composite layers is used to prepare the cell, while in other embodiments of the present disclosure, a structure of multiple composite layers can be used, and the present disclosure is not limited to this. Preferably, when there are two composite layers in the cell 10, the second tunneling layer 1024 and the second doped polysilicon layer 1025 can not only function as barrier layers in subsequent processes, but also ensure that the thickness of the first doped polysilicon layer 1023 is in a suitable range, allowing the cell to have high current and low light absorption effects.

For example, when using the LPCVD method to form the above-mentioned doped polysilicon layer, it can form a microcrystalline silicon layer first, and at a temperature of 800° C.-930° C., dope the microcrystalline silicon layer with a doping source of phosphorus and then anneal and crystallize to form the doped polysilicon layer.

Figure 5:
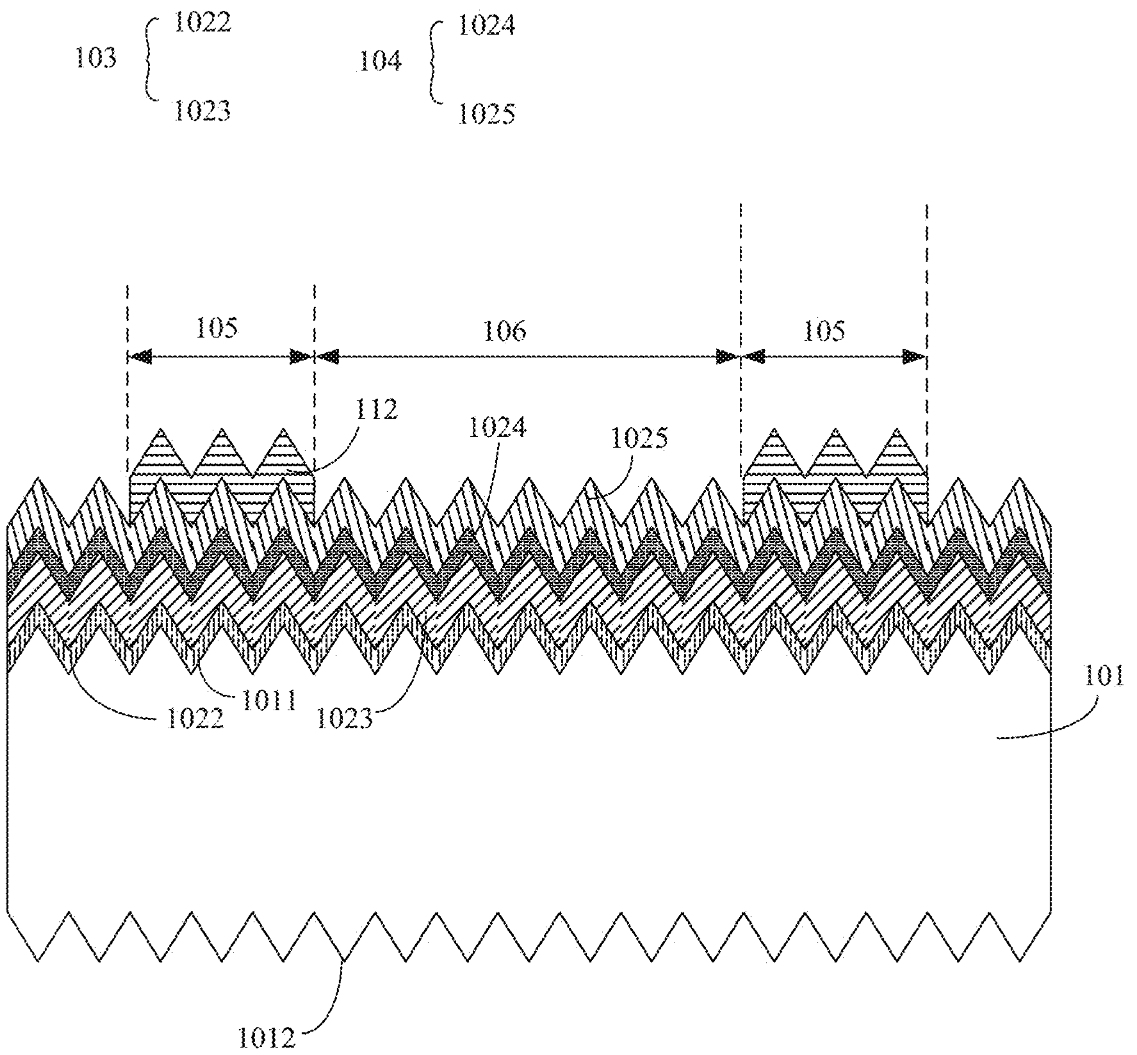

Referring to FIG. 5, laser scanning is used to distinguish the contact area 105 from the non-contact area 106, wherein 50 W green light picosecond laser can be used for scanning. As shown in FIG. 5, the laser scans part of the second doped polysilicon layer 1025 during the scanning process, and it grows a 3 nm-6 nm thick silicon oxide film 112 in the area scanned by the laser, thereby obtaining the first semi-finished cell shown in FIG. 5. It can be seen from FIG. 5 that the area scanned by the laser is the contact area 105, and the area not scanned by the laser is the non-contact area 106. After this process, the first semi-finished cell has a plurality of spaced and adjacently arranged contact areas 105 and non-contact areas 106 on side of the substrate front surface 1011.

Figure 6:
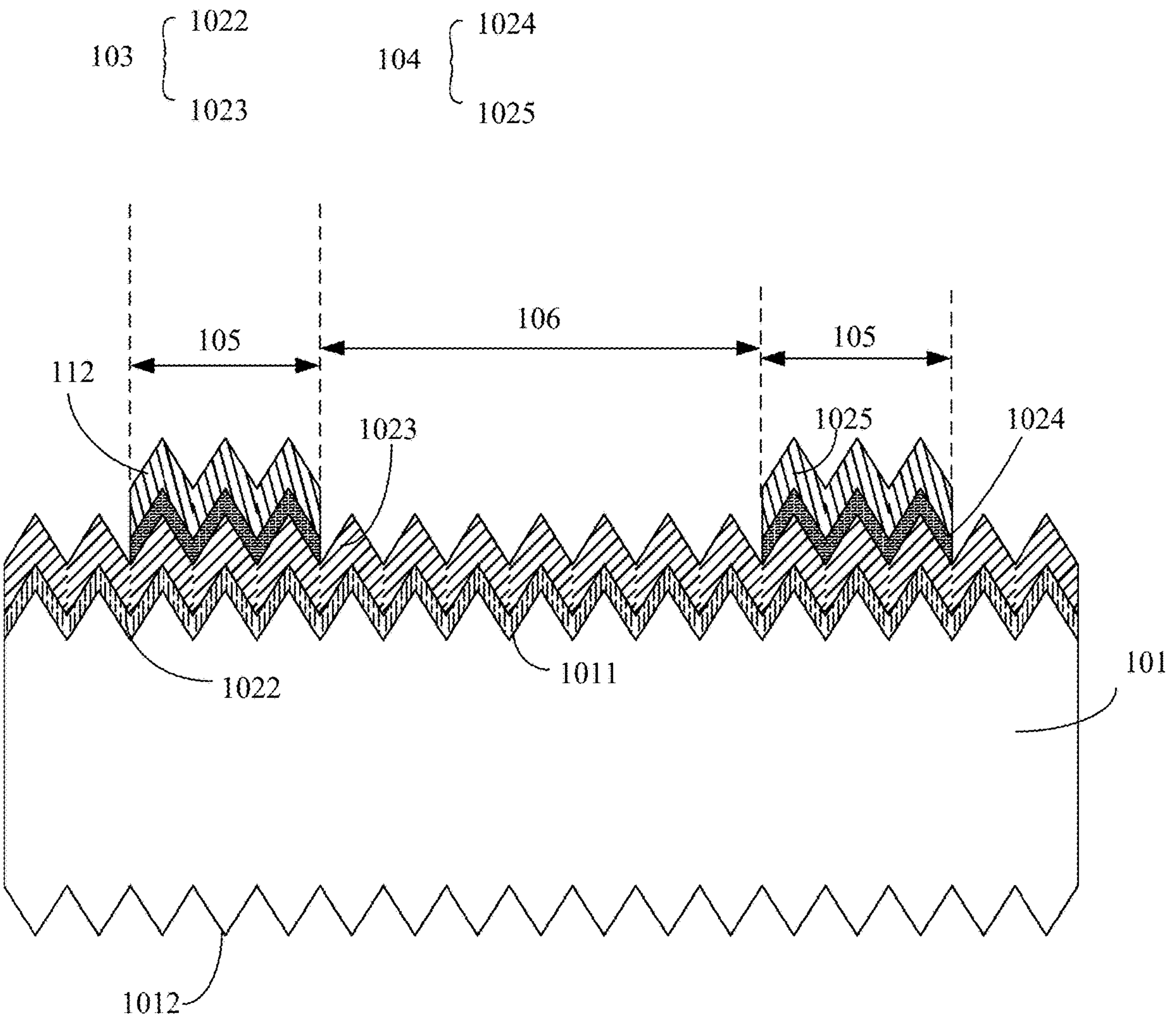

Referring to FIG. 5 and FIG. 6, based on the first semi-finished cell in FIG. 5, the first semi-finished cell in FIG. 5 can be etched using an alkaline solution containing an additive that slows the reaction. The alkaline solution etches the silicon oxide film 112 very slowly, therefore, the silicon oxide film 112 and the second tunneling layer 1024 as shown in FIG. 5 can serve as etching barrier layers for the contact area 105 and the non-contact area 106 respectively. Specifically, in the contact area 105, due to the etching blocking effect of the silicon oxide film 112, the first composite layer 103 and the second composite layer 104 are retained. In the non-contact area 106, the second doped polysilicon layer 1025 in the second composite layer 104 is etched by the alkaline solution, and the first composite layer 103 is retained under protection of the second tunneling layer 1024 in the second composite layer 104. Finally, a hydrofluoric acid (HF) solution is used to remove the silicon oxide film 112 and the second tunneling layer 1024 in the contact area 105 to form a cell structure as shown in FIG. 6. As shown in FIG. 6, each contact area 105 includes two composite layers 103 and 104, and each non-contact area 106 only includes one composite layer 103.

Figure 7:
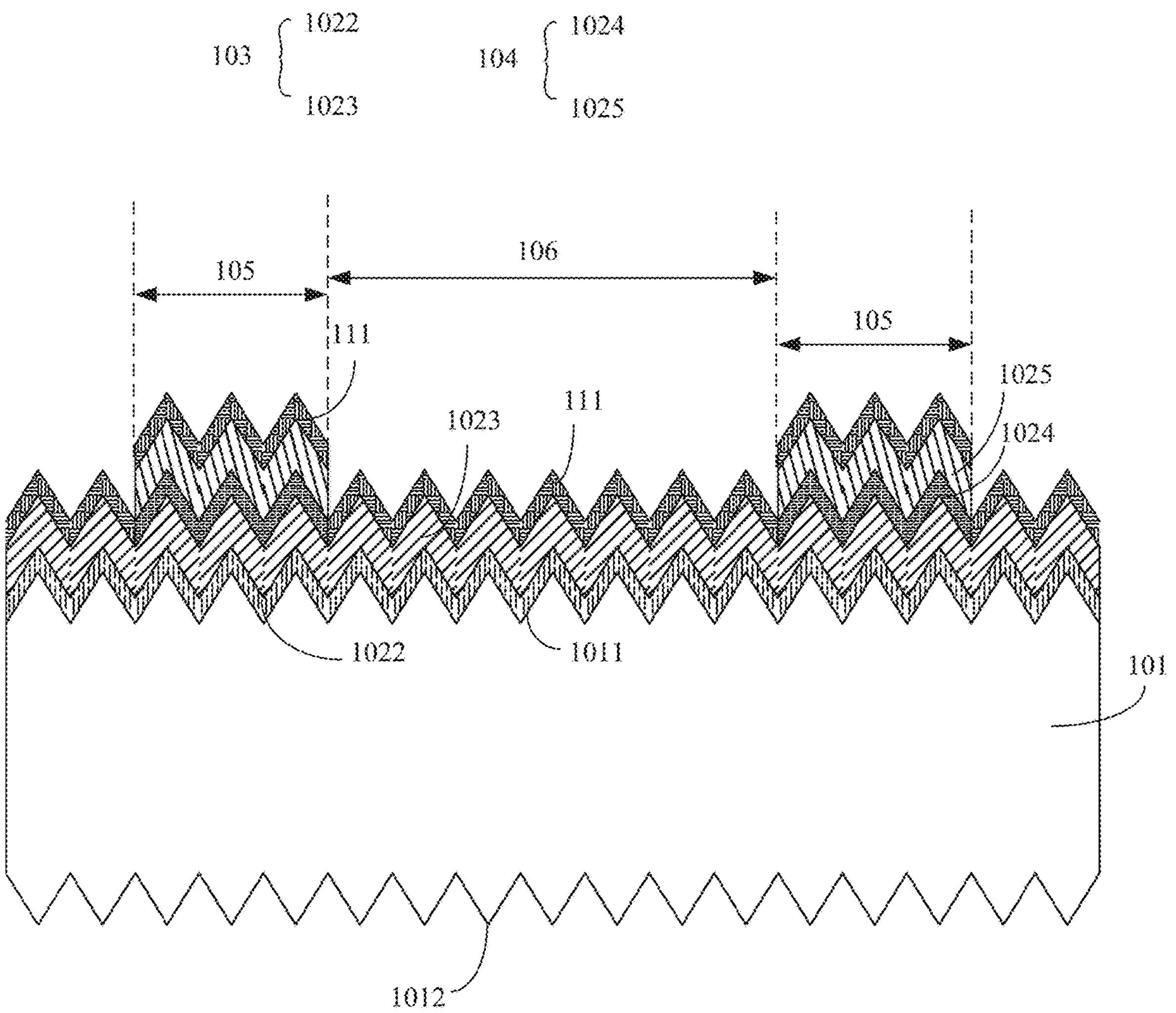

Referring to FIG. 7, the method 20 further comprises using ALD method or PECVD method to prepare a dielectric antireflection layer 111 on the substrate front surface 1011, wherein the thickness range of the dielectric antireflection layer 111 is 60 nm-120 nm. The dielectric antireflection layer 111 includes a single dielectric layer or a stacked dielectric layer composed of one or more dielectric materials among aluminum oxide, silicon oxide, silicon nitride, silicon oxynitride and magnesium fluoride.

Figure 8:
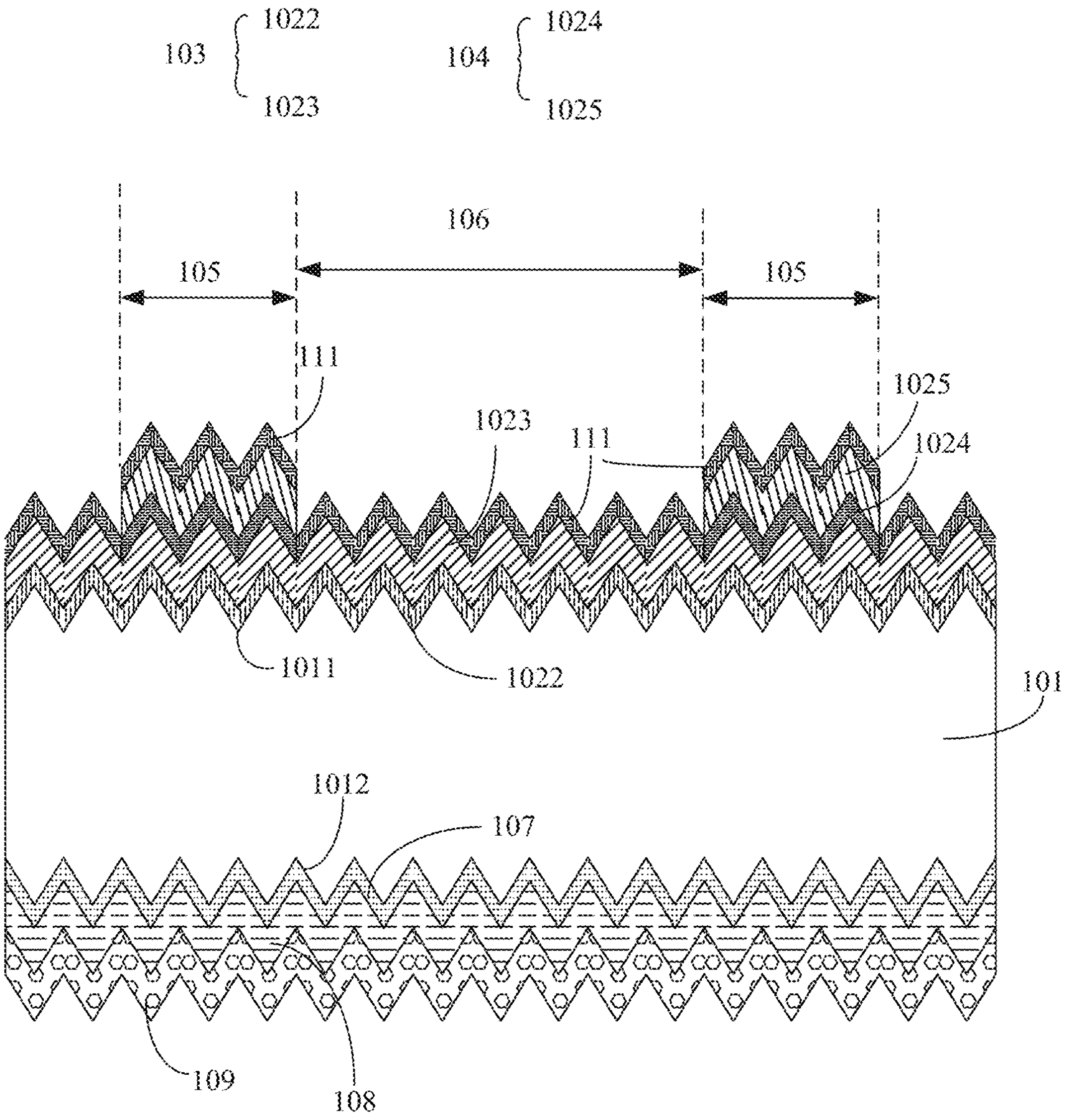

Referring to FIG. 8, it uses a single-sided cleaning machine to remove the backside coating layer of the cell silicon wafer shown in FIG. 7, and then uses concentrated sulfuric acid, hydrogen peroxide/ammonia, and hydrogen peroxide/hydrochloric acid mixture to clean the cell silicon wafer in sequence. It then uses CVD method to deposit an intrinsic amorphous silicon layer 107 with a thickness of 5 nm-20 nm on the back surface, and deposits a backside doped layer 108 with a thickness of 5 nm-45 nm on the intrinsic amorphous silicon layer 107. Then it deposits a transparent conductive layer 109 with a thickness of 70 nm-120 nm on the backside doped layer 108 using the PVD method, and the transparent oxide in the transparent conductive layer 109 may be tin-doped indium oxide (ITO), or fluorine-doped tin oxide (FTO), or aluminum-doped zinc oxide (AZO), or boron-doped zinc oxide (BZO).

Figure 9:
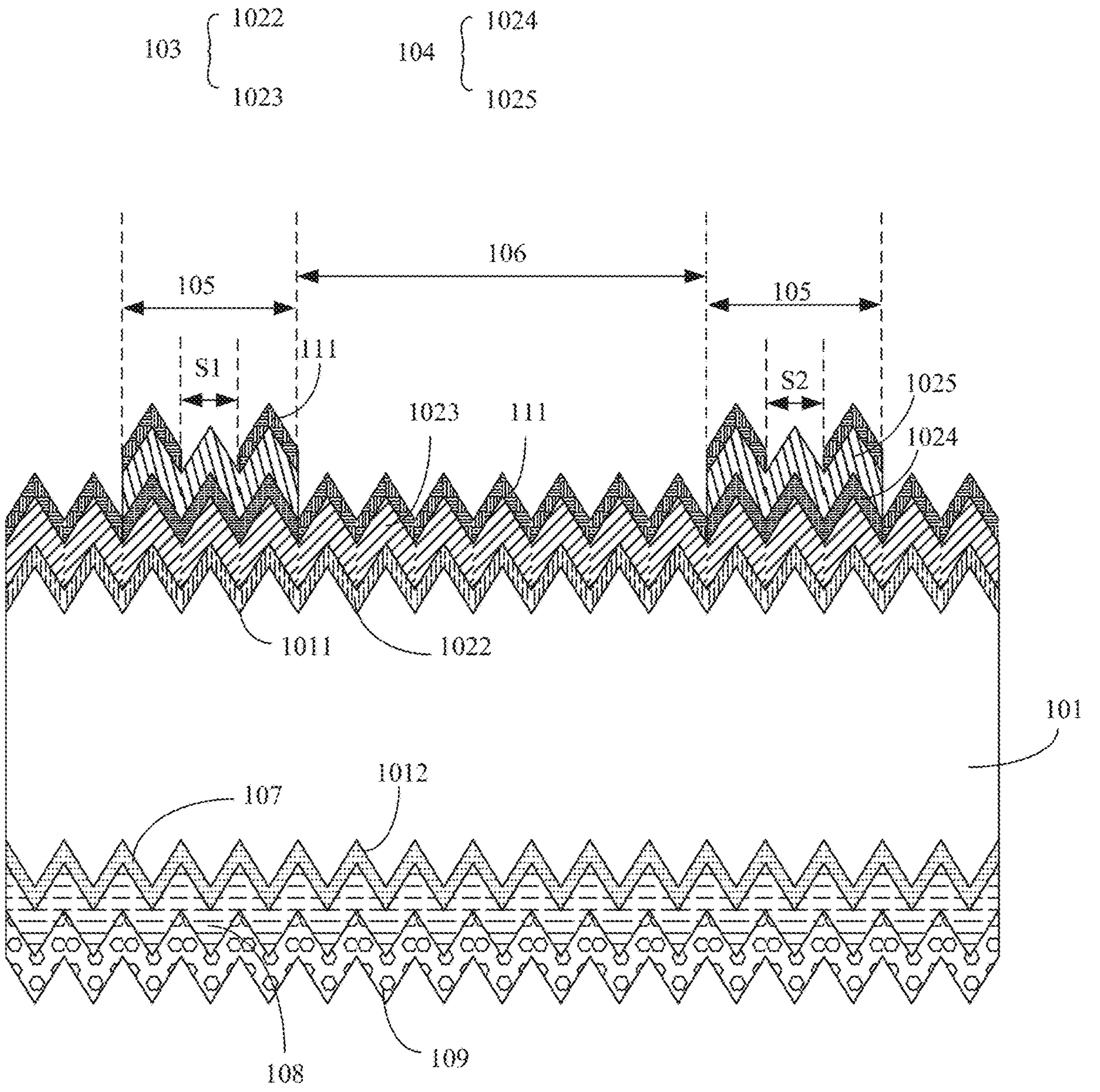

Referring to FIG. 9, it uses 80 W purple picosecond laser to scan area S1 and area S2 which are part of the dielectric antireflection layers 111 located in the contact areas 105. Due to the high-temperature hot melt effect of laser scanning, the dielectric antireflection layer 111 in areas S1 and S2 is peeled off to expose the second doped polysilicon layer 1025 in the contact area 105. Since there is a thick second composite layer 104 under the areas S1 and S2, the laser damage is sufficiently reduced and the passivation effect of the cell 10 will not be affected.

Finally, referring to FIG. 1, after the above steps, it electroplates the positive metal electrode 113 and the back metal electrode 114 on the front and back surface respectively by using method of electroplating, and electroplating metal materials include one or more of Ti, Cr, Ni, Mo, Sn, Pb, Pd, Cu, Ag, In, Al, etc., or a combination of several stacked forms. The method of electroplating metal includes electrodeposition, light-induced deposition or chemical deposition, or the screen printing method, or it can use screen printing method to print low-temperature silver past on the front and back surface to form a cell 10 as shown in FIG. 1.

The basic concepts have been described above, obviously, for those skilled in the art, the above disclosure of the disclosure is only an example, and does not constitute a limitation to the present disclosure. Although not expressly stated here, various modifications, improvements and amendments to this disclosure may be made by those skilled in the art. Such modifications, improvements, and amendments are suggested in this disclosure, so such modifications, improvements, and amendments still belong to the spirit and scope of the exemplary embodiments of this disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "one embodiment" or "an embodiment" or "an alternative embodiment" in different places in this specification do not necessarily refer to the same embodiment. In addition, certain features, structures or characteristics of one or more embodiments of the present disclosure may be properly combined.

In the same way, it should be noted that in order to simplify the expression disclosed in the present disclosure and help the understanding of one or more embodiments of the disclosure, in the foregoing description of the embodiments of the present disclosure, sometimes multiple features are combined into one embodiment, drawings or descriptions thereof. However, this method of disclosure does not imply that the subject matter of the disclosure requires more features than are recited in the claims. Indeed, embodiment features are less than all features of a single foregoing disclosed embodiment.

In some embodiments, numbers describing the quantity of components and attributes are used, it should be understood that such numbers used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the specification and claims are approximations that can vary depending upon the desired characteristics of individual embodiments. In some embodiments, numerical parameters should take into account the specified significant digits and adopt the general digit reservation method. Although the numerical ranges and parameters used in some embodiments of the present disclosure to confirm the breadth of the scope are approximate values, in specific embodiments, such numerical values are set as precisely as practicable.

Although the present disclosure has been described with reference to the current specific embodiments, those of ordinary skill in the art should recognize that the above embodiments are only used to illustrate the present disclosure, and various equivalent changes or substitutions can also be made without departing from the spirit of the present disclosure, therefore, as long as the changes and modifications to the above-mentioned embodiments are within the spirit of the present disclosure, they will all fall within the scope of the claims of the present disclosure.

The invention claimed is:

1. A method of preparing a hybrid heterojunction solar cell, comprising:

preparing a semiconductor substrate, the semiconductor substrate has a substrate front surface and a substrate back surface opposite to each other, wherein the substrate front surface is close to a light-facing side of the cell and the substrate back surface is close to a backlight side of the cell;

preparing at least two composite layers and a positive metal electrode on the substrate front surface sequentially, each composite layer includes a multi-layer structure of a tunneling layer and a doped polysilicon layer sequentially arranged in a direction gradually away from the substrate front surface; and preparing an intrinsic amorphous silicon layer, a backside doped layer, a transparent conductive layer, and a back metal electrode on the substrate back surface sequentially, wherein the backside doped layer includes a single layer or a multi-layer structure composed of a doped amorphous silicon, nanocrystalline silicon and/or microcrystalline silicon, wherein preparing the at least two composite layers further includes:

sequentially forming a first tunneling layer, a first doped polysilicon layer, a second tunneling layer and a second doped polysilicon layer on the substrate front surface;

laser scanning part of the second doped polysilicon layer to grow a silicon oxide film to obtain a first semi-finished cell, the first semi-finished cell has a plurality of spaced and adjacently arranged contact areas and non-contact areas on a side of the substrate front surface, wherein, the contact areas are scanned by the laser, and the non-contact areas are not scanned by the laser;

etching the first semi-finished cell by using an alkaline solution to remove the second doped polysilicon layer of the non-contact areas;

removing the silicon oxide film and the second tunneling layer of the non-contact areas, so that each of the contact areas includes two composite layers, and each of the non-contact areas only includes one composite layer.

2. The method according to claim 1, further comprising, when preparing the semiconductor substrate, etching the semiconductor substrate by using an alkali solution to remove contaminants and form an antireflective texture structure.

3. The method according to claim 1, wherein forming the first tunneling layer and the second tunneling layer each comprises thermal oxidation, and forming the first doped polysilicon layer and the second doped polysilicon layer each comprises LPCVD or PECVD method.

4. The method according to claim 3, wherein when forming the first doped polysilicon layer and the second doped polysilicon layer, the method further includes forming a microcrystalline silicon layer first, and at a temperature of 800° C.-930° C., doping with a doping source of phosphorus, annealing and crystallizing the microcrystalline silicon layer to form the doped polysilicon layer.

5. The method according to claim 1, further comprising using ALD or PECVD to prepare a dielectric antireflection layer on the substrate front surface, and the dielectric antireflection layer includes a single dielectric layer or a stacked dielectric layer composed of one or more dielectric materials among aluminum oxide, silicon oxide, silicon nitride, silicon oxynitride and magnesium fluoride.

6. The method according to claim 5, wherein a portion of the dielectric antireflection layer is located in the contact areas, further comprising laser scanning the part of the dielectric antireflection layer located in the contact areas to expose the second doped polysilicon layer in the contact areas, and preparing the positive metal electrode on the exposed second doped polysilicon layer.

* * * * *